United States Patent [19]
Gabelich

[11] Patent Number: 5,874,832
[45] Date of Patent: Feb. 23, 1999

[54] PRECISE HIGH RESOLUTION NON-CONTACT METHOD TO MEASURE DIELECTRIC HOMOGENEITY

[75] Inventor: Stephen A. Gabelich, Long Beach, Calif.

[73] Assignee: Raytheon Company, Lexington, Mass.

[21] Appl. No.: 770,466

[22] Filed: Dec. 20, 1996

[51] Int. Cl.$^6$ .................................................. G01R 27/26
[52] U.S. Cl. ........................ 324/688; 324/663; 324/690; 361/281
[58] Field of Search ..................................... 324/660, 661, 324/662, 663, 664, 671, 686, 688, 690, 341; 361/278, 279, 280, 281

[56] References Cited

U.S. PATENT DOCUMENTS

| | | | |
|---|---|---|---|
| 3,879,644 | 4/1975 | Maltby | 324/688 |
| 4,845,421 | 7/1989 | Howarth et al. | 324/688 |
| 5,081,421 | 1/1992 | Miller et al. | 324/688 |
| 5,223,796 | 6/1993 | Waldman et al. | 324/688 |
| 5,389,884 | 2/1995 | Nakamura et al. | 324/688 |
| 5,459,406 | 10/1995 | Louge | 324/688 |
| 5,546,005 | 8/1996 | Rauchwerger | 324/688 |

OTHER PUBLICATIONS

ASTM D–150, "Standard Test Methods for A–C Loss Characteristics and Permittivity (Dielectric Constant) of Solid Electrical Insulating Materials", ASTM Standard D 150–87, American Society for Testing and Materials, undated.

H.S. Endicott et al, "Measurement of Permittivity and Dissipation Factor Without Attached Electrodes", in 1960 Annual Report, Conference on Electrical Insulation, NAS–NRC Publication 842, 1961, pp. 19–30 (month unavailable).

W.P. Harris et al, "Precise Measurement of Dielectric Constant by the Two–Fluid Technique", in 1962 Annual Report, Conference on Electrical Insulation, NAS–NRC Publication 1080, 1963, pp. 51–53 (month unavailable).

I. Yu, "Electrodeless measurement of RF dielectric constant and loss", Measurement Science Technology, vol. 4, Nov. 1992, pp. 344–348.

"Dielectric Materials Measurements: Solutions Catalog of Fixtures and Software", Hewlett–Packard Company, Microwave Instrument Division, 1993, pp. 2–21 (month unavailable).

*Primary Examiner*—Diep N. Do
*Attorney, Agent, or Firm*—Leonard A. Alkov; Glenn H. Lenzen, Jr.

[57] ABSTRACT

An apparatus and method for measuring the dielectric constant or permittivity at a plurality of positions on a test specimen are provided. Accordingly, the present invention enables the spatial variance of the dielectric constant, i.e., the dielectric homogeneity, of the test specimen to be measured. In particular, high resolution dielectric homogeneity measurements are performed at low frequency (100 kHz to 10 MHz) using a specially designed guarded electrode assembly and a specially selected high permittivity matching liquid. The guarded electrode assembly comprises a guarded electrode surrounded by a guard electrode which is supported over a test specimen resting on a planar electrode. The test specimen and the planar electrode are immersed in a dielectric fluid. The guarded electrode as well as the guard electrode, which extends into the dielectric fluid, are translated across the test specimen while the capacitance between the guarded electrode and the planar electrode is measured. The present invention is designed so that the number of required measurements are reduced compared to other techniques for measuring permittivity. The present invention also overcomes problems associated with prior art methods such as long processing times, low accuracy, and low resolution. Accordingly, the present invention permits rapid accurate high resolution measurements of dielectric homogeneity at a significant cost reduction in contrast to prior art methods.

23 Claims, 6 Drawing Sheets

FIG. 1.
(PRIOR ART)
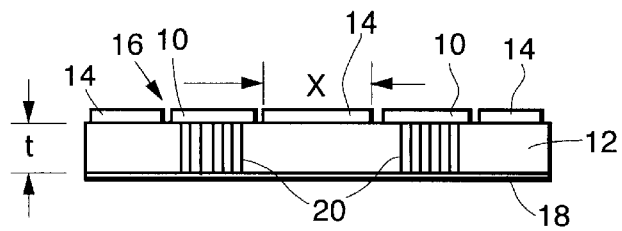
FIG. 2.
(PRIOR ART)
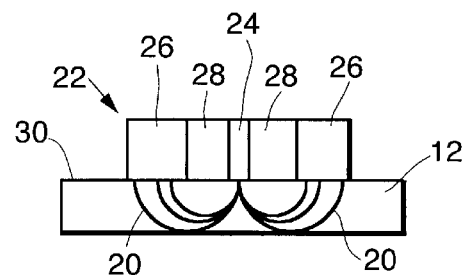
FIG. 3.
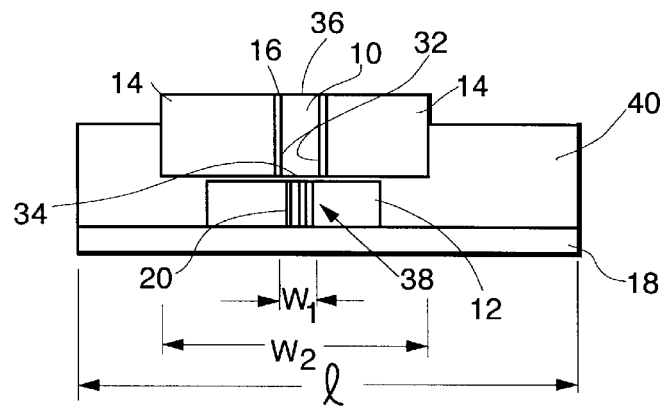
FIG. 4a.   FIG. 4b.
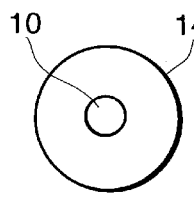 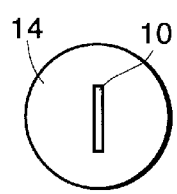

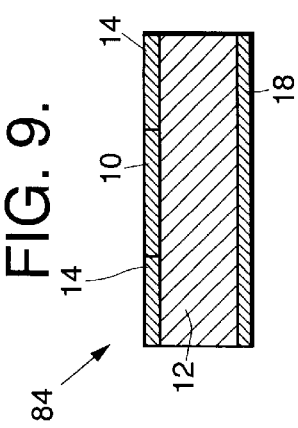
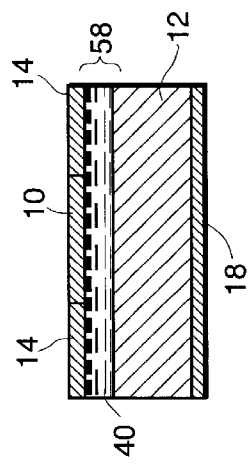
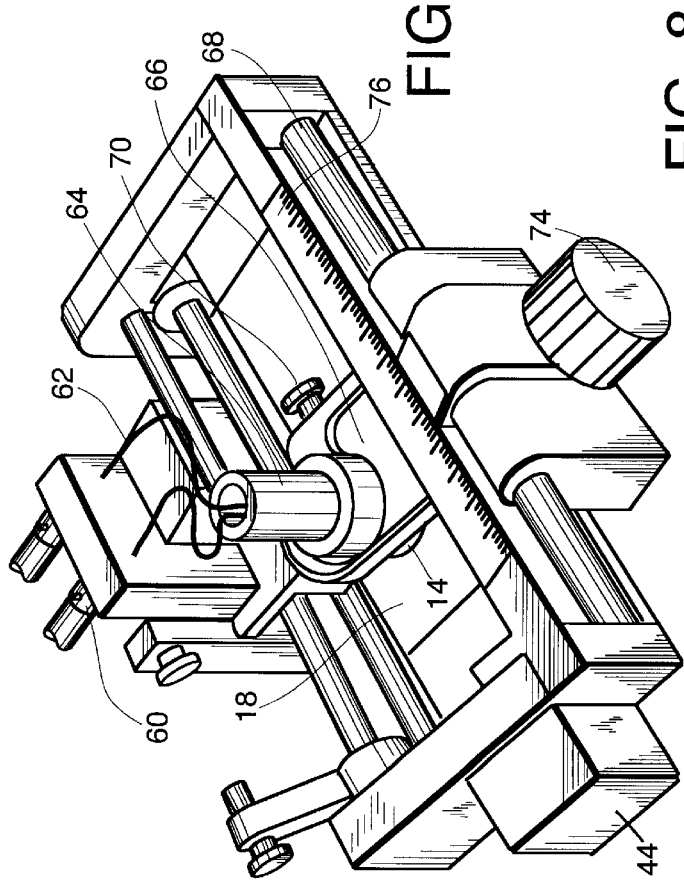
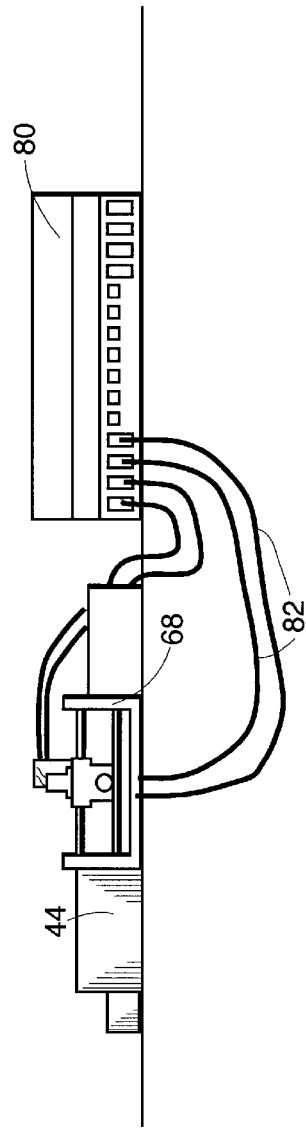

PRECISE HIGH RESOLUTION NON-CONTACT METHOD TO MEASURE DIELECTRIC HOMOGENEITY

BACKGROUND OF THE INVENTION

1. Field of the Invention

The present invention relates generally to measuring the dielectric constant of a material and, more particularly, to measuring the spatial variation of the dielectric constant.

2. Description of Related Art

The dielectric material needed to construct Continuous Transverse Stub-Electrically Scanned Array (CTS-ESA) radar antennas is barium strontium titanate (BST). Barium strontium titanate is a voltage variable dielectric (VVD) material which can operate from DC to microwave frequencies of 12 GHz and beyond. As used herein, the term microwave frequencies is used in its accepted meaning to correspond to frequency bands at about 1 GHz and above, for example, to about 300 GHz. By voltage variable dielectric is meant a dielectric material having a dielectric constant which varies with applied voltage.

The dielectric constant of BST also varies with position. As used herein, the term "dielectric constant" corresponds to the "real dielectric constant". Accordingly, the real dielectric constant as measured over a region on a given material may vary with the location on that material where the measurement is conducted. Dielectric homogeneity corresponds to the extent to which the real dielectric constant varies with position. In particular, dielectric homogeneity is defined as the measure of the spatial variance of the real dielectric constant of a material. High and low dielectric homogeneity correspond to low and high spatial variance, respectively.

The dielectric homogeneity of a material used to construct a CTS-ESA antenna directly impacts the magnitude of the side lobes in the antenna pattern. High dielectric homogeneity yields low side lobes, while low dielectric homogeneity produces high side lobes. High side lobes are detrimental to antenna performance as less energy is associated with the central beam of the antenna. Side lobes also reduce the antenna's ability to discriminate between a main target and off-axis clutter. Consequently, the characterization of the dielectric homogeneity of the material used to construct a CTS-ESA antenna is important.

Precise high resolution dielectric homogeneity measurements performed at microwave frequencies, however, are not practical, and in many cases, impossible. At low frequencies (i.e., lower than microwave frequencies), guarded electrode capacitance measurements are conventionally used to measure the dielectric constant of materials; see, e.g., ASTM D-150, "Standard Test Methods for A-C Loss Characteristics and Permittivity (Dielectric Constant) of Solid Electrical Insulating Materials," ASTM Standard D 150-87, American Society for Testing and Materials. By guarded electrode capacitance measurement is meant that the capacitance is measured between two electrodes, a guarded electrode and an unguarded electrode, wherein the guarded electrode, in practice, has sides and two ends, and is surrounded on all the sides by a guard electrode which is separated therefrom by a guard gap. Fringing and stray capacitance at the edge (i.e., sides) of the guarded electrode are essentially eliminated by the addition of the guard electrode provided that the guard gap is sufficiently small.

To measure the dielectric constant or the permittivity of a material, a test specimen of the material is placed between the guarded electrode and the unguarded electrode and the capacitance therebetween is measured. (As used herein, "permittivity" corresponds to the "real permittivity".)

The capacitance measurements which are conventionally employed are separated into two categories: contact and non-contact. Contact methods employ electrodes which are in direct mechanical contact with the test specimen. Non-contact methods employ electrodes which do not contact the test specimen.

Contact methods are the most commonly employed means for measuring the dielectric constant or the permittivity of a material. With contact methods, the dielectric constant is determined directly from a capacitance measured between a pair of electrodes. However, it is difficult to avoid an air gap between the electrodes and the test specimen when rigid electrodes and a rigid test specimen are used. Additionally, the effect of such an air gap becomes greater as the permittivity of the material being tested increases and the thickness of the test specimen decreases.

Consequently, the rigidity and high permittivity of BST requires that for BST-based materials, vacuum deposited electrodes are employed. Vacuum deposited electrodes are formed directly on the test specimen (e.g., by sputtering or evaporation, etc.) and, thus, avoid the formation of an air gap. Accordingly, to determine the dielectric homogeneity, multiple capacitance measurements are performed using a plurality discrete guarded electrodes which are metallized directly onto the surface of the BST. In particular, metal such as gold and/or silver is deposited on the test specimen thereby forming a metal film. Portions of the metal film are removed to create a plurality of isolated regions in the metal film which serve as the discrete electrodes. Typically a line of metal pads (discrete electrodes) is formed to sample the dielectric constant across the test specimen. This line of discrete electrodes is surrounded by a larger region of metallization which acts as a guard. Individual capacitive measurements are made at each of the metal pads to establish the variation in capacitance across the test specimen. In some cases, in order to further reduce stray capacitance when a capacitance measurement at a given metal pad is taken, any adjacent metal pads (typically two) are electrically connected to the surrounding larger region of metallization using jumpers.

This method of measuring dielectric homogeneity, however, is time consuming; the entire process takes a minimum of four days.

This method of using discrete guarded electrodes to perform multiple capacitance measurements also lacks the desired accuracy in determining the permittivity or dielectric constant. One source of uncertainty in computing the permittivity is in the determination of the dimensions of the individual discrete electrodes. The dimensional variation of the electrodes is a significant source of error associated with this method. Dimensional variations of the test specimen will also affect the accuracy of the measurements (as is true for all techniques), however, the test specimens are typically ground with tight dimensional tolerances, e.g., ±0.0001 inch (0.0025 mm) for a given lot.

Another source of error originates from stray capacitance. To conduct each capacitance measurement, electrical connection to the electrodes is completed using a four point probe or wires attached to each of the discrete guarded electrodes. A four-point probe is the preferred means of electrical connection. Both four-point probes and attached wires, however, produce stray capacitance. Disadvantageously, the stray capacitance associated with each of the guarded electrodes is different. In the case of the four-point probe, the inconsistencies in the stray capacitance result from moving the probe and/or the test specimen as each discrete electrode is tested. Stray capacitance can be a significant source of error since the values of capacitance to be measured are small, i.e., in the same range as the noise produced by the stray capacitance. Due to the uncertainty in the dimensions of the individual electrodes and to the inconsistent stray capacitance associated with each individual electrode, the dielectric homogeneity, as determined using this method, lacks the desired accuracy.

Additionally, positioning restrictions for the discrete guarded electrodes limit the spatial resolution of the dielectric homogeneity measurements. Typically, it is desirable to have the guard electrode extend beyond the guarded electrode by at least twice the thickness of the test specimen. Consequently, the guarded electrodes must be spaced apart by a distance that is greater than twice the thickness of the test specimen. Such spacing requirements restrict the placement of each of the discrete guarded electrodes. The resolution of the measurement of the dielectric homogeneity is thus limited. (It will be appreciated that when electrical jumpers are used to electrically connect adjacent metal pads to the surrounding larger region of metallization, the guard electrode need not necessarily extend beyond the guarded electrode by at least twice the thickness of the test specimen. However, in this case where jumpers are employed and the guard electrode does not extend beyond the guarded electrode by at least twice the thickness of the test specimen, then some uncertainties may exist in the capacitance measurements.)

Alternatively, non-contact methods can be used to measure the dielectric constant of materials at low frequency (i.e., lower than microwave frequencies). Non-contact methods include fluid displacement methods wherein multiple capacitance measurements (at least four) are obtained using two or more dielectric fluids or liquids; see, e.g., H. S. Endicott et al, "Measurement of Permittivity and Dissipation Factor Without Attached Electrodes", in 1960 *Annual Report, Conference on Electrical Insulation*, NAS-NRC Publication 842, 1961, pp. 19–30 and W. P. Harris et al, "Precise Measurement of Dielectric Constant by the Two-Fluid Technique", in 1962 *Annual Report, Conference on Electrical Insulation*, NAS-NRC Publication 1080, 1963, pp. 51–53. For example, a test specimen is introduced into a cell filled with a dielectric fluid and the change in capacitance is determined, first when the cell is filled with a dielectric fluid having a low permittivity and second when the cell is filled with a dielectric fluid having a higher permittivity. The permittivity of the specimen is calculated using the permittivities of the two dielectric fluids and the two capacitances changes.

Fluid displacement methods, however, involve placing the test specimen between electrodes and then removing the specimen. This process can result in misalignment and, thus, affect the accuracy of the calculated location and value of permittivity measured. Fluid displacement methods are also time consuming since they require changing the dielectric fluid.

An additional non-contact method used to measure the dielectric constant of liquids at low frequency is reported by, e.g., I. Yu, "Electrodeless measurement of RF dielectric constant and loss", Measurement Science Technology, Vol. 4, 1993, pp. 344–348.

Some non-contact (or probe-type) methods can measure the permittivity of materials at microwave frequencies. The most common of these non-contact techniques is to employ an open-ended coaxial line sensor such as the HP 85070A dielectric probe available from Hewlett-Packard Company (Santa Rosa, Calif.). Probes of this type, however, suffer large uncertainties when used to conduct measurements on rigid materials having low loss or high permittivity. Difficulties (described above) result from the air gap formed between the probe and the rigid material. The BST-based material for use in fabricating CTS-ESA antennas is a rigid material having low loss and high permittivity. Accordingly, an open-ended coaxial line sensor is not the ideal probe for performing dielectric homogeneity measurements on BST-based material. Additionally, when conducting measurements on low loss materials having finite thickness, and in particular, for thin test specimens, microwave energy can reflect off a back surface thereby confusing the measurement.

Coaxial line probes, and non-contact microwave frequency techniques, in general, suffer additional disadvantages. Other non-contact microwave frequency techniques such as free space techniques are based on directing a microwave beam at or through a slab of material and measuring the reflection and/or transmission coefficients; see, e.g., "Dielectric Materials Measurements: Solutions Catalog of Fixtures and Software", Hewlett Packard Company, Microwave Instrument Division, 1993, pp. 2–21. As a result of fringing and the divergence of the microwave beam, however, these non-contact microwave frequency techniques do not sample a precisely well defined region with uniformly distributed incident microwave energy. These non-contact microwave frequency techniques also lack the desired resolution. Additionally, the orientation of the electric fields associated with the coaxial line probes and the diverging microwave beam include components that are both perpendicular and parallel to the surface of the test specimen. Consequently, these non-contact microwave frequency techniques do not independently sample the components of the dielectric constant perpendicular and/or parallel to the surface (which are different for anisotropic materials). Accordingly, the anisotropic nature of BST-based material can cause erroneous conclusions to be produced when using such non-contact microwave frequency techniques to measure the permittivity or dielectric constant.

Thus, there remains a need for a method for measuring dielectric homogeneity that avoids most, if not all, the foregoing problems.

SUMMARY OF THE INVENTION

In accordance with the present invention, an apparatus and method is provided for measuring variation in the dielectric constant of a test specimen. The apparatus comprises:

(a) a guarded electrode having sides and two ends and having a width;

(b) a guard electrode surrounding the guarded electrode on the all sides, the guard electrode having a width, the guard electrode and the guarded electrode separated by a guard gap, at least one of the ends of the guarded electrode being exposed;

(c) a planar electrode having the test specimen residing thereon, the guarded electrode and the guard electrode residing over the test specimen such that the end of the guarded electrode which is exposed faces the test specimen;

(d) a container having sides and a bottom, the planar electrode residing on the bottom of the container;

(e) a dielectric fluid filling a portion of the container such that the test specimen, the planar electrode, the end of the guarded electrode which faces the test specimen, and a portion of the guard electrode are submerged in the dielectric fluid;

(f) means for translating the guarded electrode and the guard electrode a distance across the test specimen, the planar electrode having a length that is longer than the width of the guarded electrode and surrounding guard electrode plus the distance that the guarded electrode and the guard electrode are translated; and (g) means for monitoring the capacitance between the guarded electrode and the planar electrode, thereby enabling the spatial variation of the dielectric constant of the test specimen to be determined.

The method of the present invention, which is intended for measuring variation in the dielectric constant of a test specimen, comprises the steps of:

(a) providing a container having sides and a bottom;

(b) placing a planar electrode having a length on the bottom of the container;

(c) placing the test specimen on the planar electrode;

(d) placing a guarded electrode having sides and two ends and having a width above the test specimen, the guarded electrode surrounded on all the sides by a guard electrode having a width, the guard electrode and the guarded electrode separated by a guard gap, at least one of the ends of the guarded electrode being exposed to the test specimen;

(e) filling a portion of the container with a dielectric fluid such that the test specimen, the planar electrode, the end of the guarded electrode which is exposed to the test specimen, and a portion of the guard electrode are submerged in the dielectric fluid;

(f) measuring the capacitance between the guarded electrode and the planar electrode;

(g) translating the guarded electrode and the guard electrode a distance across the test specimen, the planar electrode having a length that is longer than the width of the guarded electrode and surrounding guard electrode plus the distance that the guarded electrode and the guard electrode are translated; and (h) repeating steps (f) and (g), thereby determining spatial variation in the dielectric constant of the test specimen.

The apparatus and method of the present invention enable precise determination of the dielectric homogeneity of materials such as BST at microwave frequencies with high resolution. The dielectric homogeneity at microwave frequencies is determined by performing measurements of the changes in real permittivity or real dielectric constant at lower frequencies in the range of about 100 kHz to 10 MHz.

The present invention is designed so that the number of required measurements are reduced compared to other techniques for measuring permittivity including those that use liquids. The present invention also overcomes problems associated with prior art methods such as long processing times, low accuracy, and low resolution. With the present invention, turn-around time can be as short as one hour and the precision of measurements of the dielectric homogeneity that can be obtained is approximated to be about 0.1% under favorable conditions such as minimal temperature variation. A precision of 0.5% is routinely achieved with the apparatus and method of the present invention. (It will be appreciated that for applications involving CST-ESA antenna design, the actual dielectric homogeneity or spatial variation in the dielectric constant is desired to be within 3%.) The accuracy of the measurement of absolute permittivity is between 1 and 10%. This accuracy depends on a variety of factors such as probe diameter (and, thus, the area of the interrogation region) as well as the thickness and permittivity of the test specimen. Additionally, resolution of 20 mils (0.508 mm) or better is possible with the method and apparatus of the present invention.

Accordingly, the present invention permits rapid accurate high resolution measurements of dielectric homogeneity at a significant cost reduction in contrast to prior art methods.

BRIEF DESCRIPTION OF THE DRAWINGS

FIG. 1 is a cross-sectional view depicting discrete guarded electrodes metallized directly on a prior art test specimen;

FIG. 2 is a cross-sectional view depicting a prior art open-ended coaxial line sensor;

FIG. 3 is a cross-sectional view depicting the apparatus of the present invention;

FIGS. 4a and 4b are cross-sectional views showing the end of the guarded electrode which is exposed to the test specimen wherein the end of the guarded electrode is depicted as circular and rectangular, respectively;

FIGS. 7 and 8 are perspective views of the apparatus of the present invention;

FIG. 9 is a cross-sectional view depicting a guarded parallel plate capacitor;

FIG. 10 is a cross-sectional view depicting a configuration similar to that of the present invention wherein a test specimen is inserted between a guarded electrode and a planar electrode and a dielectric fluid separates the guarded electrode from the test specimen;

DESCRIPTION OF THE PREFERRED EMBODIMENTS

Figure 5:
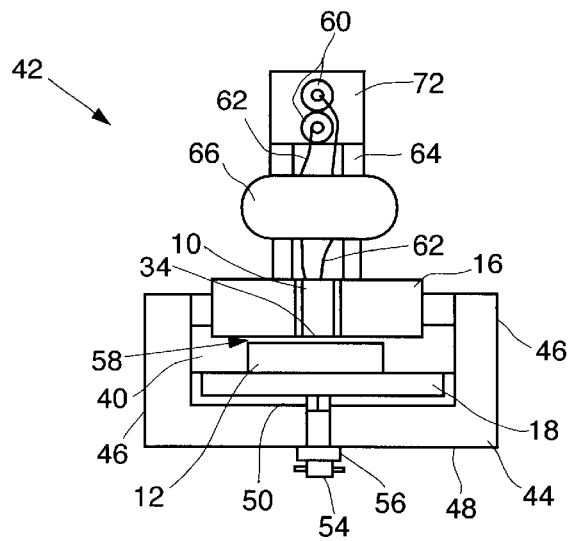
FIGS. 5 and 6 are cross-sectional views showing end and side views of the apparatus of the present invention, respectively.

Reference is now made in detail to a specific embodiment of the present invention, which illustrates the best mode presently contemplated by the inventor for practicing the invention. Alternative embodiments are also briefly described as applicable.

The present invention is directed to an apparatus and method for measuring the dielectric constant or permittivity at a plurality of positions on a test specimen. Accordingly, the present invention enables the spatial variance of the dielectric constant, i.e., the dielectric homogeneity, of the test specimen to be measured. In particular, high resolution dielectric homogeneity measurements are performed at low frequency (e.g., 100 kHz to 10 MHz) using a specially designed non-contact guarded electrode assembly and a specially selected high permittivity matching liquid.

The apparatus for measuring the dielectric constant of a test specimen comprises:
(a) a guarded electrode having sides and two ends and having a width;
(b) a guard electrode surrounding the guarded electrode on all the sides, the guard electrode having a width, the guard electrode and the guarded electrode separated by a guard gap, at least one of the ends of the guarded electrode being exposed;
(c) a planar electrode having the test specimen residing thereon, the guarded electrode and the guard electrode residing over the test specimen such that the end of the guarded electrode which is exposed faces the test specimen;
(d) a container having sides and a bottom, the planar electrode residing on the bottom of the container;
(e) a dielectric fluid filling a portion of the container such that the test specimen, the planar electrode, the end of the guarded electrode which faces the test specimen, and a portion of the guard electrode are submerged in the dielectric fluid;
(f) means for translating the guarded electrode and the guard electrode a distance across the test specimen, the planar electrode having a length that is longer than the width of the guarded electrode and the surrounding guard electrode plus the distance that the guarded electrode and the guard electrode are translated; and
(g) means for monitoring the capacitance between the guarded electrode and the planar electrode thereby enabling spatial variation of the dielectric constant of the test specimen to be determined.

As described above, the term "dielectric constant", as used herein, corresponds to the "real dielectric constant". Also, the term "permittivity", as used herein, corresponds to the "real permittivity".

Accordingly, the apparatus of the present invention senses changes in real dielectric constant (or real permittivity) across the test specimen.

Examples of prior art apparatus for measuring the dielectric constant include: discrete guarded electrodes metallized directly on the test specimen and open-ended coaxial line sensors shown in FIGS. 1 and 2, respectively. In particular, FIG. 1 depicts sense electrodes 10 formed on a test specimen 12. Each of the sense electrodes 10 is surrounded on all sides by guard electrodes 14. The sense electrodes 10 and the guard electrodes 14 are separated by a guard gap 16. Consequently, the sense electrodes 10 are electrically isolated from the guard electrodes 14. The test sample 12 rests on a source electrode 18. The capacitance is measured between the sense electrodes 10 and the source electrode 18. Electric field lines 20 directed between the sense electrodes 10 and the source electrode 18 are shown. FIG. 1 depicts both the width, x, of the guard electrodes 14 and the thickness, t, of the test specimen 12. As described above, the width, x, of the guard electrodes 14 is required to be greater than twice the thickness, t, of the test specimen 12. Consequently, the spacing between two sense electrodes 10 which are adjacent must be greater than twice the thickness, t, of the test specimen 12. (The spacing therebetween may be less when electrical jumpers are used, as described above.) Such spacing requirements, however, restrict the placement of each of the sense electrodes 10. The resolution of the measurement of dielectric homogeneity is thus limited. With the present invention, however, there are no such restrictions that limit the positions on the test specimen 12 where adjacent measurements can be obtained.

FIG. 2 depicts an open-ended coaxial line sensor which is used to probe a test specimen 12. A coaxial line sensor 22 comprising an inner conductor 24 surrounded by an outer conductor 26 rests on the test specimen 12. The inner conductor 24 is electrically isolated from the outer conductor 26 by a dielectric insulator 28 which resides therebetween. Electric field lines 20 directed between the inner conductor 24 and the outer conductor 26 are shown. As described above, the orientation of the electric field lines 20 include components that are both perpendicular and parallel to the surface 30 of the test specimen 12. Consequently, the open coaxial line sensor does not independently sample the components of the dielectric constant perpendicular and/or parallel to the surface 30 (which are different for anisotropic materials). Accordingly, if the test specimen 12 comprises a material which is anisotropic, then erroneous conclusions may be drawn when using the open coaxial line sensor to perform measurements of the dielectric constant or permittivity. In contrast, the electric field in the present invention is directed perpendicular to the surface 30 of the test specimen 12, and therefore, independently samples the component of the dielectric constant perpendicular to that surface. For the CTS-ESA antennas, the electric field is also perpendicular to the surface 30, and thus, it is preferable to measure the dielectric constant perpendicular to the surface. Accordingly, the polarization of the electric field in the present invention is consistent with the current intended final application of the CTS-ESA BST material.

Alternate prior art methods for measuring the dielectric constant include: fluid displacement methods and free space techniques. Fluid displacement methods involve multiple capacitance measurements which are obtained using two or more dielectric fluids or liquids. As described above, this process can result in misalignment and, thus, affect the accuracy of the calculated location and value of permittivity. Additionally, fluid displacement methods are time consuming since changing the dielectric fluid is required.

The present invention is similar to the fluid displacement methods only in that a dielectric fluid is employed. However, the present invention does not rely on fluid displacement and requires only one dielectric fluid.

Free space techniques, as described above, are based on directing a microwave beam at or through a slab of material and measuring the reflection and/or transmission coefficients. As a result of fringing and the divergence of the microwave beam, these free space techniques do not sample a precisely well-defined region with uniformly distributed incident microwave energy. In contrast, the present invention samples a precisely well-defined region with a uniformly distributed electric field at high resolution.

A schematic drawing of the present invention is shown in FIG. 3. The present invention includes a guarded electrode (sense electrode) 10 and a long planar electrode (source electrode) 18. The guarded electrode 10 has sides 32 and two ends 34 and 36. A guard electrode 14 surrounds the guarded electrode 10 on all the sides 32. The guard electrode 14 and the guarded electrode 10 are separated by a guard gap 16 which comprises an insulator such as Teflon (polytetrafluoroethylene). Accordingly, the guarded electrode 10 is electrically isolated from the guard electrode 14.

FIG. 3 shows the guarded electrode 10 having the width, $w_1$, and the guard electrode 10 having the width, $w_2$. The planar electrode 18 has a length, l. In accordance with the present invention, the length, l, of the planar electrode 18 is longer that the width, $w_1$, of the guarded electrode 10, as well as the width, $w_2$, of the guard electrode 10 particularly in the dimension of travel of the guard electrode.

The planar electrode 18 provides a platform upon which the test specimen 12 comprising, e.g., BST, rests. The guarded electrode 10 and the guard electrode 14 reside over or above the test specimen 12 such that one end 34 of the guarded electrode 10 is exposed to the test specimen 12. The guarded electrode 10 and the guard electrode 14 may or may not contact the test specimen 12. Preferably, the guarded electrode 10 and the guard electrode 14 do not contact the test specimen 12. However, it is possible that the guarded electrode 10 and the guard electrode 14 could lightly scrape against and therefore touch the surface 30, either intentionally or non-intentionally. Such contact does not affect the measurement provided that the test specimen 12 is secure and does not move.

Consequently, with an AC voltage applied between the guarded electrode 10 and the planar electrode 18, electric field lines 20 are directed therebetween. Since the test specimen 12 (which comprises a dielectric material) is located between the guarded electrode 10 and the planar source electrode 18, the electric field lines 20 pass directly through the test specimen. In this manner, the test specimen 12 can be probed.

It will be appreciated that the electric field lines 20 are columnar if the guard gap 16 is narrow, e.g., 1 mil (0.001 inch). Preferably, the guard gap 16 comprises Teflon.

It will further be appreciated that the shape of guarded electrode 10 determines the shape of the interrogation region 38, i.e., the region of the test specimen 12 which is probed. FIGS. 4a and 4b show the end 34 of the guarded electrode 10 which is exposed to the test specimen 12. In accordance with the present invention, the guarded electrode 10 is surrounded by the guard electrode 14. In FIG. 4a, the end 34 of the guarded electrode 10 is depicted as circular while in FIG. 4b, the end 34 of the guarded electrode 10 is shown to be rectangular. Accordingly, the electric field lines 20 would form a column having a circular cross-section for the guarded electrode 10 depicted in FIG. 4a, while the electric field lines would form a column having a rectangular cross-section for the guarded electrode depicted in FIG. 4b. Guarded electrodes 10 having other shapes to accommodate different engineering purposes are possible as long as machining can be accomplished to provide a guard gap of about 0.001 inches (0.0025 cm).

In accordance with the present invention, the test specimen 12 and the planar electrode 18, as well as a portion of the guarded electrode 10 (the end 34 which faces the test specimen) and a portion of the surrounding guard electrode 14 are submerged in a dielectric fluid 40 (seen in FIG. 5). A dielectric fluid 40 having high permittivity is required for the successful operation of the invention. The dielectric fluid 40 is used to 10 improve the capacitance coupling between the guarded electrode 10 and the planar electrodes 18 through the test specimen 12. Preferably, the dielectric fluid 40 comprises ethanol which is a fluid having high permittivity; that is, for high precision measurements it is desirable that the permittivity of the fluid is at least half (50%) of the permittivity of the test specimen 12. Other dielectric fluids having high permittivity can be suitably employed in the present invention as well. Examples of other suitably employed dielectric fluids 40 include isopropyl alcohol, glycol, and glycerol. In particular, ethanol, isopropyl alcohol, and glycol were tested and determined to be chemically compatible with a test specimen 12 comprising a BST/polystyrene composite. Less than 0.03% swelling of the BST/polystyrene composite was observed after 100 hours of exposure to these dielectric fluids 40. Other possible dielectric fluids 40 such as methanol may be employed in the apparatus and method of the invention as well. Methanol, which swells BST/polystyrene composites, can be used when characterizing other materials.

Measurements of the dielectric constant and/or dielectric homogeneity of the test specimen 12 are performed by monitoring the capacitance between the guarded electrode 10 and the planar electrode 18 as the guarded electrode is translated across the test specimen. The capacitance between the guarded electrode 10 and the planar electrode 18 is not measured at microwave frequencies but is measured at lower frequencies, in particular, between about 100 kHz and 10 MHz.

Figure 6:
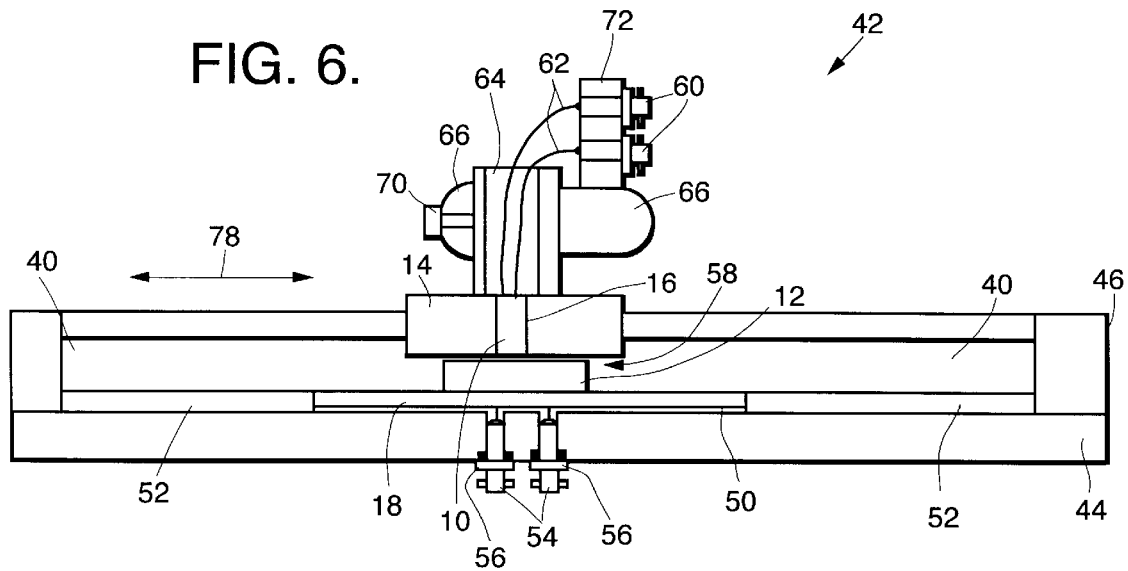

The apparatus 42 for measuring the dielectric constant at a plurality of positions on a test specimen 12 is illustrated in more detail in FIGS. 5–8. FIGS. 5 and 6 schematically show end and side views of the apparatus, i.e., the non-contact guarded electrode assembly 42 of the present invention, while FIG. 7 depicts the apparatus of the present invention in three dimensions. FIG. 8 provides another side view of the apparatus. The planar electrode 18 and the test specimen 12 which rests thereon are shown in a container 44. In this example, the container 44 is an open container, however, the present invention is not limited to the use of open containers. Rather, a container 44 which is closed, such as a container with a sliding lid, may be employed in the present invention. The container (open container) 44 has sides 46 and a bottom 48. The planar electrode 18 is supported on the bottom 48 of the open container 44 by insulator 50 (preferably comprising Teflon) which separates the planar electrode from the open container. Additional insulation 52 to secure the planar electrode 18 in the open container or tank 44 is shown in FIG. 6. The planar electrode 18 is electrically connected to a first set of BNC connectors 54 which are electrically isolated from the tank 44 by O-ring seals 56. The O-ring seals 56 provide a leak-free seal. As described above, the planar electrode 18 and the test specimen 12 are submerged in dielectric fluid 40, with the end 34 of the guarded electrode 10 (as well as a portion of the guard electrode 14) being submerged in the dielectric fluid 40 as well. A gap 58 separates the guarded electrode 10 and the guard electrode 14 from the test specimen 12. Preferably, the gap 58 has a thickness less than about 2 mil (0.002 inches; 0.051 mm).

The guarded electrode 10 is electrically connected to a second set of BNC connectors 60 by connecting wires 62. The connecting wires 62 are electrically shielded by shield 64 which is attached to the guard electrode 14. Additionally, shield 64 serves as an electrical extension of the guard electrode 14 and reduces stray capacitance as seen from the top end 36 of the guarded electrode 10. The shield 64, along with the electrode assembly (i.e., the guarded electrode 10 and the surrounding guard electrode 14), is mechanically supported by electrode clamp 66 which is attached to a translation stage 68 (see FIG. 7). It will be appreciated that the shield 64 provides a convenient adjustable attachment location for the electrode clamp 66. A set screw 70 secures shield 64 to the electrode clamp 66 as shown in FIGS. 6 and 7. The second set of BNC connectors 60 are supported by a fixture 72 mounted on the electrode clamp 66.

FIG. 7 shows the translation adjustment knob 74 and translation scale 76 which aid in the translation of the guarded electrode 10 across the test specimen 12. The direction of motion that the guarded electrode 10 is translated in indicated by arrow 78 shown in FIG. 6. An impedance analyzer 80 for monitoring the capacitance between the guarded electrode 10 and the planar electrode 18 as well as BNC cables 82 for electrically connecting the first set of BNC connectors 54 and second set of BNC connectors 60 to the impedance analyzer are depicted in FIG. 8. Other suitable means for measuring the capacitance may be employed in the present invention as well. As described above, the capacitance between the guarded electrode 10 and the planar electrode 18 is measured at frequencies in the range of about 100 kHz and 10 MHz. Accordingly, the dielectric constant can be determined at various positions on the test specimen 12.

The dielectric constant or permittivity is directly determined from the capacitance measured between the guarded electrode 10 and the planar electrode 18 with the test specimen 12 therebetween. Referring now to FIG. 9, a guarded parallel plate capacitor 84 comprising a guarded electrode 10 (and associated guard electrodes 14), a planar electrode 18, and a test specimen 12 inserted therebetween are shown. It will be appreciated that for such a guarded parallel plate capacitor 84 as illustrated in FIG. 9, the relationship between the absolute value of the relative dielectric constant (or relative permittivity, $\in_r$) of the test specimen 12 and the measured capacitance between the guarded electrode 10 and the planar electrode 18 (in pF), $C_m$, (neglecting stray capacitance), is characterized by the following equation:

$$\in = (C_m)(t)/A/0.2244,$$

where t denotes the thickness of the test specimen (in inches) and A corresponds to the effective area covered by the guarded electrode (in square-inches). The value 0.2244 in the equation above is a correction factor for the units employed.

As described above, dielectric homogeneity corresponds to changes or variations in the dielectric constant or permittivity within a test specimen. Since a linear relationship exists between the measured capacitance, $C_m$, and the permittivity, $\in_r$, the dielectric homogeneity can be determined by measuring changes in capacitance at various locations throughout the test specimen 12.

It will be appreciated that capacitance changes can be measured more accurately than the absolute value of capacitance. The fact that capacitance changes can be measured more accurately is important, since mapping the dielectric homogeneity of a material such as BST with high resolution involves capacitance measurements on the order of less than 2 pF. Such capacitance measurements can be measured precisely, i.e., with a high precision. The term "precision" is used herein in its accepted meaning of the number significant digits to which the measurements is reliable. However, capacitance measurements on the order of less than 2 pF are difficult to measure with absolute accuracy. The measured value of capacitance may not correspond to the actual capacitance of the test specimen 12 over the region measured. However, the difference in separate measurements of capacitance can be determined more accurately than absolute measurements of capacitance.

The present invention takes advantage of the fact that the difference in separate measurements of capacitance can be determined more accurately. For instance, the stray capacitance originating from the connecting wires 62 will be the same for each separate measurement of capacitance made across the test specimen 12. Thus, the stray capacitance will be subtracted out of the dielectric homogeneity which is derived from the difference or change in the capacitance across the test specimen 12. Consequently, measurements of dielectric homogeneity on the order of several femtofarads often can be obtained.

The relationship between the change in the relative dielectric constant (or relative permittivity), $\Delta\in_r$, of the test specimen 12 and the change in measured capacitance between the guarded electrode 10 and the planar electrode 18 (in pF), $\Delta C_m$, (neglecting stay capacitance), is characterized by the following equation:

$$\Delta\in_r = (\Delta C_m)(t)/(A)/0.2244.$$

As described above, t denotes the thickness of the test specimen (in inches) and A corresponds to the effective area covered by the guarded electrode (in square-inches). The value 0.2244 in the equation above is a correction factor for the units employed.

The present invention differs from the guarded parallel plate capacitor 84 shown in FIG. 9 in that a dielectric fluid 40 separates the guarded electrode 10 from the test specimen 12. FIG. 10 depicts a configuration similar to that of the present invention. A test specimen 12 is inserted between a guarded electrode 10 and a planar electrode 18. As described above, the guarded electrode 10 is surrounded by guard electrodes 14. Dielectric fluid 40 such as ethanol separates the guarded electrode 10 from the test specimen 12. It will be appreciated that the dielectric fluid also separates the test specimen 12 from the planar electrode 18. An incidental separation remains between the planar electrode 18 and the test specimen 12 as a result of the differences in surface finishes for the planar electrode and test specimen. This separation is desirably much less than the gap 58 between the guarded electrode 10 and the test specimen 12.

In the case where the guarded electrode 10 is not in direct contact with the test specimen 12, the measured capacitance between the guarded electrode and the planar electrode 18, $C_m$, differs from the true or actual capacitance of the test specimen 12. The changes in measured capacitance between the guarded electrode 10 and the planar electrode 18, $\Delta C_m$, which is employed to determine the dielectric homogeneity, is related to changes in true or actual capacitance of the test specimen 12 by a correction factor. Thus, changes in measured capacitance, $\Delta C_m$, are also related to changes in permittivity by a correction factor. This correction factor or sensitivity factor, S, is given by the following expression:

$$S = (C_m/C_{sample})(\partial C_{sample}/\partial C_m) = 1 + (\in_{sample}/\in_{gap})(t_{gap}/t_{sample}),$$

where $C_m$ is the measured capacitance, $C_{sample}$ is the true or actual capacitance of the test specimen 12 (e.g., BST), and $\partial$ is the notation for the partial derivative. Additionally, $\in_{sample}$ corresponds to the relative dielectric constant of the test specimen 12, $\in_{gap}$ corresponds to the relative dielectric constant of the dielectric fluid 40 filling the gap 58, $t_{sample}$ corresponds to the thickness of the test specimen, and $t_{gap}$ corresponds to the thickness of the gap separating the guarded electrode 10 and the test specimen.

It will be appreciated that the guard gap or space 16 separating the guarded electrode 10 and guard electrode 14 is assumed to be small, thereby creating an interrogation region 38 which is columnar in shape. The guard gap 16 is preferably about 1 mil (0.0254 mm). Second order effects, such as variation in the sensitivity of the dielectric fluid 40 (e.g., ethanol) caused by slight changes in the dielectric constant of the dielectric fluid are ignored in practice. Alternatively, such changes in the dielectric constant of the dielectric fluid 40 can be included in the measurement.

Thus, for small changes in measured capacitance, $\Delta C_m$, the true or actual capacitance change across test specimen 12 corresponds to the change in measured capacitance, $\Delta C_m$, multiplied by the sensitivity factor, S. In most cases where the permittivity of the test specimen 12 and that of the dielectric fluid 40 are matched, the equation above defining the sensitivity factor, S, is valid for inhomogeneity between 10 to 20%. Accordingly, changes in permittivity or the changes in the dielectric constant, e.g., the dielectric homogeneity, can be determined by the following equation:

$$\Delta \in_r = (\Delta C_m)(S)(t)/A/0.2244.$$

Capacitance measurements are preferably performed with S close to unity; that is, the measured capacitance, $C_m$, and the true or actual capacitance across the test specimen 12, $C_{sample}$, are almost identical. Thus, the gap 58 separating the guarded electrode 10 and the test specimen 12 can effectively be ignored and measurement errors can be reduced. It will be appreciated, however, that in practice the thickness of the gap 58 can be established and incorporated in the calculation of $\Delta \in_r$.

Preferably, S ranges between 1.008 and 1.02. Such values of S are obtained when $t_{gap}$ is much less than $t_{sample}$ ($t_{gap} \ll t_{sample}$) and $\in_{gap}$ is large relative to $\in_{sample}$. Preferably, $t_{gap}$ is less than about 2 mils (0.051 mm) and $t_{sample}$ is in the range between about 50 and 150 mils (1.27 and 3.81 mm). The value of $\in_{gap}$ can be increased relative to $\in_{sample}$ by using a dielectric fluid 40 having high permittivity, e.g., ethanol.

Figure 11:
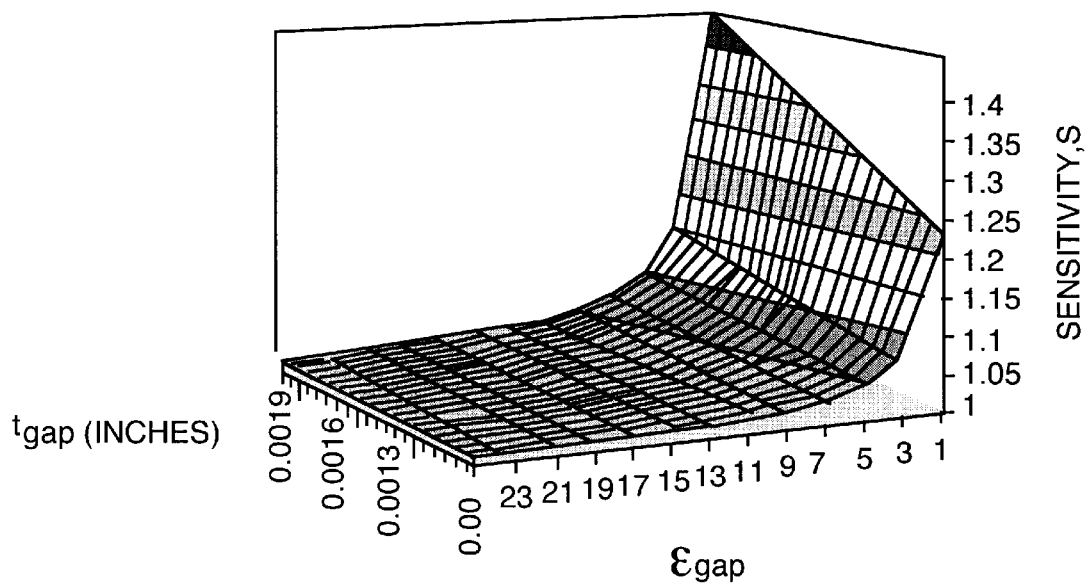
FIG. 11 on coordinates of sensitivity, relative permittivity, and thickness (in inches), is a plot of the sensitivity, S, versus permittivity of the dielectric fluid, $\in_{gap}$, and thickness of the gap, $t_{gap}$, for a test specimen comprising BST inserted between a guarded electrode and a planar electrode as shown in FIG. 10.

The effect on the sensitivity factor, S, of a dielectric fluid 40 having high permittivity is illustrated in FIG. 11 which depicts a plot of the sensitivity versus permittivity of the gap 58, $\in_{gap}$, and thickness of the gap, $t_{gap}$, for a test specimen 12 comprising BST inserted between a guarded electrode 10 and a planar electrode 18 as shown in FIG. 10. The test specimen 12 comprising BST has a relative dielectric constant of 30 and a thickness, $t_{sample}$, of 0.135 inches (0.34 cm). As described above, the guarded electrode 10 and the test specimen 12 are separated by the dielectric fluid 40.

Depicted on the horizontal axis in the foreground of the plot shown in FIG. 11 is the relative permittivity or relative dielectric constant of the gap 58, $\in_{gap}$, which may contain air or may be filled with a dielectric fluid 40. It will be appreciated that a dielectric constant equal to 1 corresponds to the dielectric constant of air and a dielectric constant equal to 25 corresponds to the dielectric constant of ethanol. Depicted on the other horizontal axis is the thickness of the separation or gap 58 between the guarded electrode 10 and the test specimen 12, $t_{gap}$, which ranges from 0.001 to 0.002 inch (0.025 to 0.051 mm). As described above, a small gap 58 is employed to provide a sensitivity factor, S, near unity. The vertical axis corresponds to the sensitivity factor, S, which preferably has a value close to unity.

As illustrated in FIG. 11, using dielectric fluids 40 such as ethanol which have high permittivity (e.g., $\in_{gap}=25$ for ethanol), lowers the sensitivity factor, S. Such dielectric fluids 40 improve the capacitance coupling between the guarded electrode 10, the planar electrode 18 through the test specimen 12.

FIG. 11 also shows that small variations in the thickness of the gap 58, $t_{gap}$, have little effect on the sensitivity, S, when a dielectric fluid 40 having high permittivity is used. As described above, for high precision measurements it is desirable that the permittivity of the dielectric fluid 40 is at least half (50%) of the permittivity of the test specimen 30. In contrast, if the gap 58 is filled with air ($\in_{gap}=1$), then the sensitivity factor, S, will vary with changes in the thickness of the gap, $t_{gap}$. Such variations in the thickness of the gap 58, $t_{gap}$, may be caused by dimensional tolerances in the thickness of the test specimen 12, $t_{sample}$, and/or by dimensional tolerances in the apparatus 42 of the present invention. Preferably, the value of the sensitivity factor, S, is known and remains constant as the guarded electrode 10 is translated across the test specimen 12.

Additionally, FIG. 11 shows that for dielectric fluids 40 having high permittivity, the sensitivity factor, S, is constant with variations in the permittivity of the dielectric fluids. Consequently, small changes in the permittivity of the dielectric fluid 40 have little effect on the sensitivity factor, S. Such small changes in the permittivity of the dielectric fluid 40 may result, for example, from changes in temperature of the dielectric fluid or from absorption of water from the atmosphere into the dielectric fluid.

Thus, the method and apparatus 42 of the present invention enable precise determination of the dielectric homogeneity of materials such as BST at microwave frequencies with high resolution. The dielectric homogeneity at microwave frequencies, however, is determined by performing measurements of the changes in real permittivity or real dielectric constant at lower frequencies in the range of about 100 kHz to 10 MHz. It will be appreciated that it has never been shown in previously published literature that measurements of capacitance obtained at low frequency can be used to determine the dielectric homogeneity of high dielectric materials like BST at high frequency (e.g., microwave frequencies). By high dielectric materials is meant ceramics having a dielectric constant greater than about 10 and typically in the range of about 30 to 100. In contrast, low dielectric materials conventionally comprise non-ceramics such as plastics having a dielectric constant less than about 5 and typically in the range of about 2 to 4.

The present invention is designed so that the number of required measurements are reduced compared to other techniques for measuring permittivity including those that use liquids. The present invention also overcomes problems associated with prior art methods such as long processing times, low accuracy, and low resolution. With the present invention, turn-around time can be as short as one hour and the precision of measurements of the dielectric homogeneity that can be obtained is approximated to be about 0.1% under favorable conditions such as minimal temperature variation. A precision of 0.5% is routinely achieved with the apparatus 42 and method of the present invention. (It will be appreciated that for applications involving CST-ESA antenna design, the actual dielectric homogeneity or spatial variation in the dielectric constant is desired to be within 3%.) The accuracy of the measurement of absolute permittivity is between 1 and 10%. This accuracy depends on a variety of factors such as probe diameter (and thus the area of the interrogation region) as well as the thickness and permittivity of the test specimen 12. Additionally, resolution of 20 mils (0.508 mm) or better is possible with the method and apparatus 42 of the present invention. Accordingly, the present invention permits rapid accurate high resolution measurements of dielectric homogeneity at a significant cost reduction in contrast to prior art methods.

Additionally, the polarization of the electric field in the present invention is consistent with the current intended final application of the CTS-ESA BST material. As described above, the electric field in the present invention is directed perpendicular to the surface 30 of the test specimen 12, and therefore, independently samples the component of the dielectric constant perpendicular to that surface. For the CTS-ESA antennas, the electric field is also perpendicular to the surface, and thus, it is preferable to measure the dielectric constant perpendicular to the surface.

The method and apparatus 42 of the present invention will find particular use in measuring the dielectric homogeneity of BST-based materials (including BST itself) to be employed in CTS-ESA antennas which operate in the X-band (8 to 12 GHz). Other frequency bands such as C-band (5.85 to 8.2 GHz) and L-band have been proposed. The present invention, however, is not limited to characterizing any particular material or end-product and is not restricted to testing materials to be used in any particular microwave frequency range. The method and apparatus of the present invention can measure dielectric homogeneity of any material with a relative dielectric constant in the range between about 1 to 100 provided that the homogeneity percent changes are within the limits of measurement accuracy, (e.g., between about 10 to 20%). Homogeneity percent changes less than 10% can be measured as well. As described above, the sensitivity factor, S, is a function of the dielectric constant, and, therefore, the sensitivity factor changes (e.g., from about 1.02 to 1.04) with inhomogeneity. If variation in the sensitivity factor, S, are included in the measurement, a high degree of accuracy can be achieved.

As described above, it will be appreciated that the determination of the dielectric constant and the dielectric homogeneity of materials at microwave frequencies with high resolution by performing measurements of the real permittivity or real dielectric constant at lower frequencies, e.g., in the range of about 100 kHz to 10 MHz, has never before been shown. Employing low frequency measurements, i.e., measurements at radio frequencies (RF) or high frequencies (HF) up to 300 MHz, to determine the dielectric constant at microwave frequencies is not obvious. The material properties at microwave frequencies are typically expected to be different than the material properties at these frequencies that are lower than microwave frequencies. Accordingly, the approach of the present invention, wherein information regarding the dielectric constant at these lower frequencies is employed to determine the dielectric constant and to map the properties such as dielectric homogeneity at microwave frequencies is clearly novel. Specifically, a direct correlation between the dielectric constant and the dielectric homogeneity at RF frequencies with the dielectric constant and dielectric homogeneity at microwave frequencies is shown. For example, an approximately one-to-one correlation between the dielectric constant at 2 MHz to the dielectric constant for the C-band is shown below. A correction factor may be employed to provide accurate measurements of the dielectric constant and dielectric homogeneity at microwave frequencies.

Additionally, a correction factor, i.e., the sensitivity factor, S, is employed in the present invention to improved the accuracy of the measurement. Use of the sensitivity factor, S, (defined above) is also novel.

EXAMPLES

EXAMPLE 1

Figure 12:
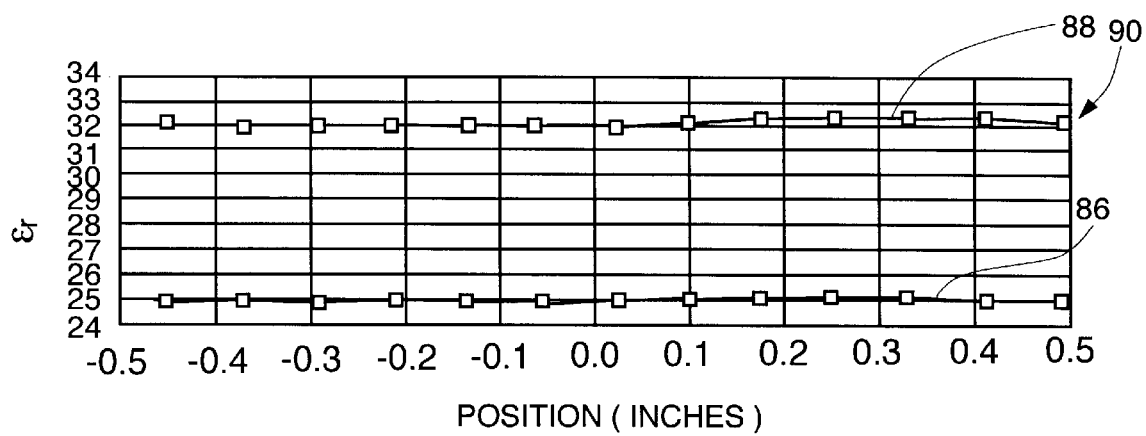
FIG. 12, on coordinates of relative permittivity and position (in inches), is a plot of the dielectric homogeneity across test specimens comprising pure ethanol and Stycast 30.

FIG. 12 shows the results of two experiments used to examine the baseline measurement accuracy and precision of the method and apparatus 42 of the present invention, as well as the ability to measure permittivity variations near the edge of a test specimen 12. It will be appreciated that the prior art methods described above for measuring the dielectric constant of materials cannot measure permittivity variations near the edge of a test specimen 12.

Curve 86 in FIG. 12 depicts the results of measurements of dielectric homogeneity across pure ethanol. Specifically, curve 86, plots the relative dielectric constant or relative permittivity, $\epsilon_r$, versus position across the test specimen 12, i.e., ethanol.

Ethanol is inherently homogeneous, i.e., the permittivity is constant throughout the dielectric fluid. Therefore, no variations in the relative permittivity or relative dielectric constant would be expected. As shown by curve 86, no variation in relative permittivity were observed. In particular, the relative permittivity was measured to be about 25. Thus, the translating motion of the apparatus 42 of the present invention does not introduce error as the dielectric homogeneity is probed.

Measurements of dielectric homogeneity were also performed on Stycast 30, a ceramic/polystyrene composite similar to BST having dielectric inhomogeneity which is low (i.e., about 1%). Curve 88, also shown in FIG. 12, plots the dielectric constant versus position across the test specimen 12, i.e., Stycast 30 having dimensions of 1.25×1.25× 0.1027 inches (3.18×3.18×0.261 cm). The relative permittivity, $\epsilon_r$, averaged about 32. The present invention was sensitive enough to detect the small variations in the permittivity of the Stycast 30. Moreover, the data at the far right of FIG. 12 (indicated by arrow 90) was measured at the edge of the test specimen 12. As shown by curve 88, no adverse effects were observed at this edge.

Measurements for curves 86 and 88 were performed at a frequency of 2 MHz.

For curve 88, a gap 58 of 1 mil (0.025 mm) was used. The end 34 of the guarded electrode 10 which is exposed to the test specimen 12 was circular with a diameter of 0.25 inch (0.635 cm). The two experiments described above prove that the method and apparatus 42 of present invention are accurate and precise, and can be used to measure dielectric homogeneity up to the edge of a test specimen 12.

EXAMPLE 2

Figure 13:
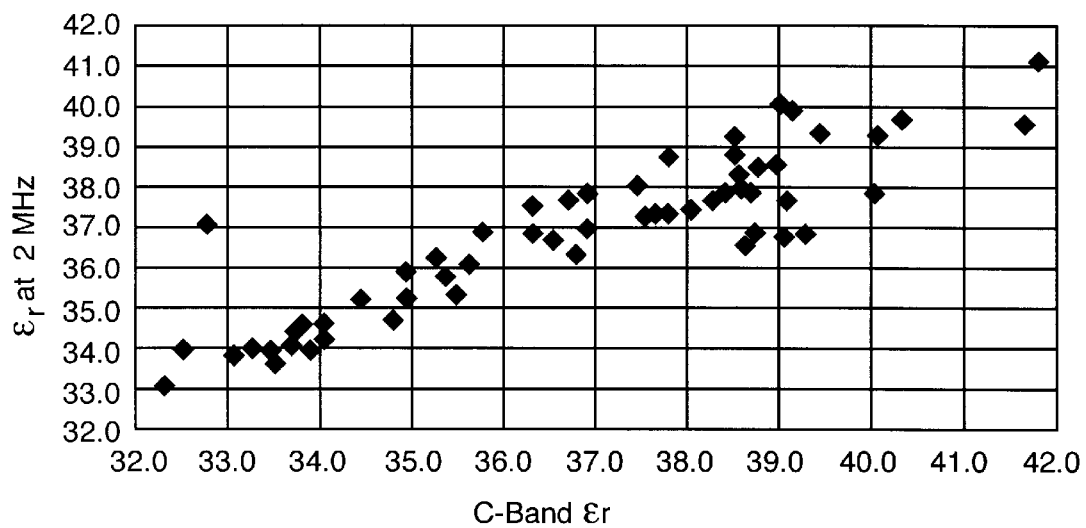
FIG. 13, on coordinates of relative permittivity at 2 MHz and C-band relative permittivity, is a plot of the average $\in_r$ at 2 MHz (determined using the apparatus of the present invention) versus C-band $\in_r$.

Measurements of the dielectric homogeneity were performed on several tiles comprising BST. The variation in the dielectric homogeneity of these tiles was known to be between 5% and 12%. The capacitance measurements performed with the method and apparatus 42 of the present invention were used to calculate the average permittivity of each tile at low frequency (i.e., 2 MHz) using a dielectric fluid 40 comprising ethanol. The average permittivity across each tile as determined by the method and apparatus 42 of the present invention were compared with the permittivity of each tile as determined by C-band parallel plate measurements; i.e., a method which is conventionally used to perform permittivity measurements at microwave frequencies. A comparison of the permittivity determined by the method of the present invention and C-band parallel plate measurements is provided in FIG. 13 which plots average $\epsilon_r$ at 2 MHz (determined using the apparatus 42 of the present invention) versus C-band $\epsilon_r$. The data shown in FIG. 13 indicate that there is good correlation between the measurements of permittivity conducted at low frequency (2 MHz) and at microwave frequencies (C-band). Thus, measurements at low frequency can be used to measure dielectric homogeneity (e.g., of BST) at microwave frequencies.

It will be appreciated that in parallel plate measurements, the microwave energy moves through the test specimen 12 in the same manner as required for CTS-ESA applications. The electric field is directed perpendicular to the surface 30 of the test specimen 12, and therefore, independently samples the component of the dielectric constant perpendicular to that surface. As described above, for CTS-ESA antennas, the electric field is also perpendicular to the surface and thus it is preferable to measure the dielectric constant perpendicular to the surface.

It will be further appreciated that both X-band and C-band measurements are performed on BST and both bands are considered equivalent in terms of evaluating real permittivity.

EXAMPLE 3

Measurements of dielectric homogeneity are conventionally performed to characterize the uniformity of BST tile. CTS-ESA antennas, however, are constructed by bonding a plurality of BST tiles together. Accordingly, measurements of dielectric homogeneity can be used to measure variations in the permittivity at a bond-line, i.e., the seam between two BST tiles which are bonded together.

Figure 14:
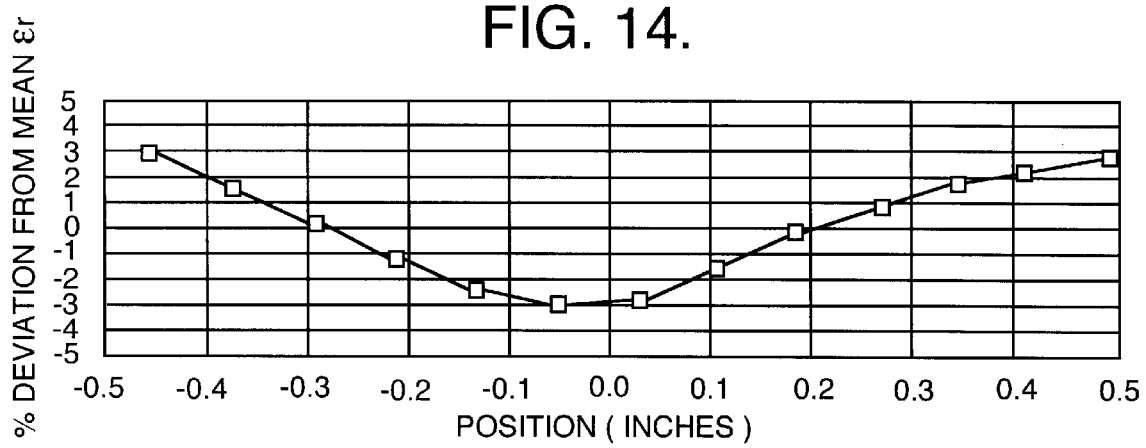
FIG. 14, on coordinates of percent deviation from the mean relative permittivity (in percent) and position (in inches), is a plot of the dielectric homogeneity across a non-bonded BST tile.

FIG. 14 depicts the dielectric homogeneity across a non-bonded BST tile. Specifically, FIG. 14 provides a plot of the percent deviation from the mean permittivity versus position on the non-bonded BST tile. Measurements for the plot in FIG. 14 were performed at a frequency of 2 MHz with a gap 58 of 1 mil (0.025 mm). The end 34 of the guarded electrode 10 which is exposed to the non-bonded BST tile was circular with a diameter of 0.25 inch (0.635 cm).

Figure 15:
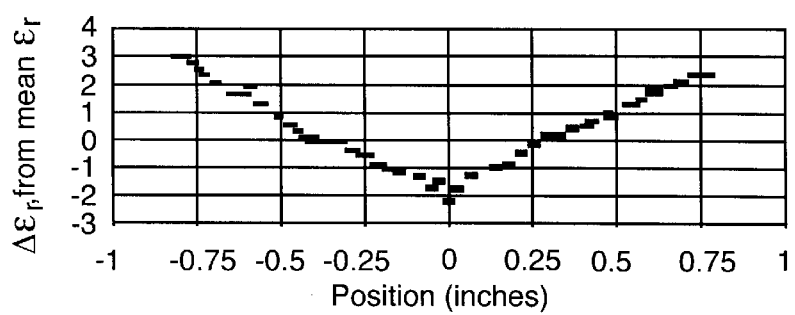
FIG. 15, on coordinates of deviation from the mean relative permittivity and position (in inches), is a plot of the dielectric homogeneity across a bonded BST tile.

A BST tile similar to the non-bonded BST tile characterized by the plot in FIG. 14 was bisected and reattached using 2.5% Rexolite-like adhesive. By Rexolite-like adhesive is meant any styrene monomer (i.e., uncured/uncrosslinked polystyrene) with an initiator/crosslinker that can be used to bond cured/crosslinked polystyrene boards such as Rexolite boards. The BST tile comprised a BST/polystyrene composite. Rexolite-like adhesive interacts with the BST/polystyrene composite producing a discontinuity in the permittivity at the bond line. FIG. 15 depicts the dielectric homogeneity across a bonded BST tile. Specifically, FIG. 15 provides a plot of the deviation, $\Delta \in_r$, from the mean permittivity versus position on the bonded BST tile. The bond line is oriented normal to the direction of motion of the guarded electrode 10 across the BST tile. Measurements of the dielectric homogeneity were performed at a frequency of 2 MHz. The end 34 of the guarded electrode 10 which is exposed to the non-bonded BST tile was rectangular with dimensions of 0.5×0.04 inch (1.27×0.1 cm). The mean permittivity of the bonded BST tile is estimated to be 29.

Depending on the magnitude and spatial distribution of the discontinuities in permittivity present at bond lines in a CTS-ESA antenna, the performance of the final aperture can be significantly compromised. The method and apparatus 42 of the present invention enables such discontinuities in permittivity to be precisely quantified.

EXAMPLE 4

Figure 16:
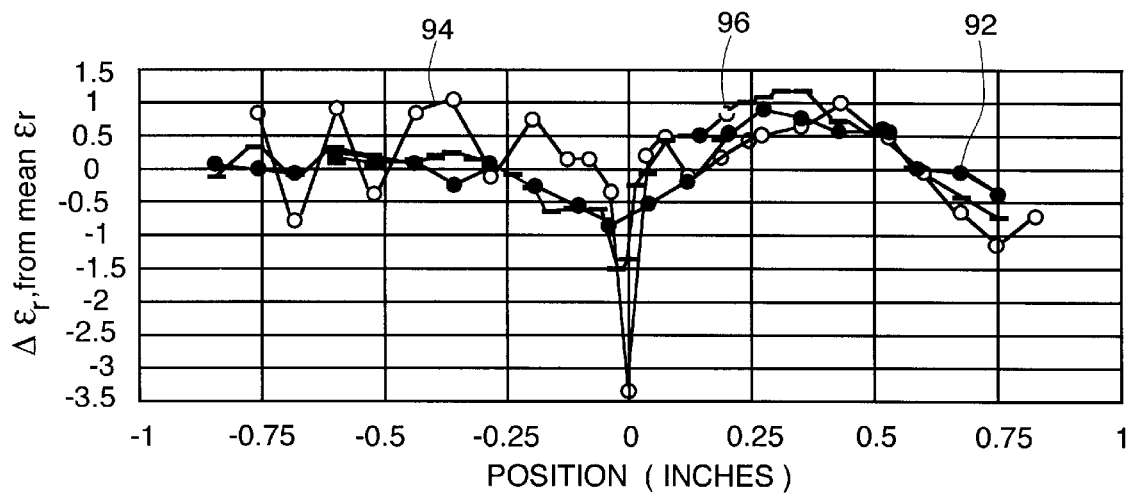
FIG. 16, on coordinates of deviation from the mean relative permittivity and position (in inches), is a plot of the dielectric homogeneity across a bonded BST tile measured using different guarded electrodes.

As described above, the shape of the guarded electrode 10 determines the shape of the interrogation region 38, i.e., the region of the test specimen 12 which is probed. Measurements of the dielectric homogeneity were performed across a bond line using different guarded electrodes 10 each having a different shape and/or size. In particular, the end 34 of the guarded electrode 10 which is exposed to the test specimen 12 may be circular or rectangular as shown in FIGS. 4a and 4b. FIG. 16 shows a comparison among three shapes which were investigated. Specifically, FIG. 16, plots the deviation, $\Delta \in_r$, from the mean permittivity versus position on the bonded BST tile measured using the method and apparatus 42 of the present invention. Rexolite-like adhesive was employed to bond the BST tile. Curves 92, 94, and 96 correspond to the cases wherein the end 34 of the guarded electrode 10 which is exposed to the bonded BST tile was circular with a diameter of 0.25 inch (0.635 cm), circular with a diameter of 0.125 inch (0.318 cm), and rectangular with dimensions of 0.5×0.04 inch (1.27×0.1 cm), respectively. The bond-line is located at 0 inches. Measurements for curves 92, 94, and 96 were performed at frequencies of 2 MHz, 10 MHz, and 2 MHz, respectively and the mean permittivity of the bonded BST tile is estimated to be 19.

The circular pattern having a diameter of 0.25 inch (0.635 cm) (curve 92) samples a large region relative to the area of the bond-line. Accordingly, a smoothing effect was observed which prevented the detection of anomalies caused by the bond line. The thin rectangular pattern (curve 96) is better suited for studying bond lines since it measures permittivity lengthwise along and near the bond-line. Accordingly, curve 96 shows a drop in permittivity at the bond-line. The circular pattern having a diameter of 0.125 inch (0.32 cm) (curve 94) samples a small area and therefore, can be used to perform measurements with fine resolution. The circular pattern having a diameter of 0.125 inch (0.32 cm) (curve 94) can also detect localized variations in permittivity which are undetectable with the other two patterns, i.e., the circular pattern having diameter of 0.25 inch (0.635 cm) (curve 92) and the thin rectangular pattern (curve 96).

EXAMPLE 5

Figure 17:
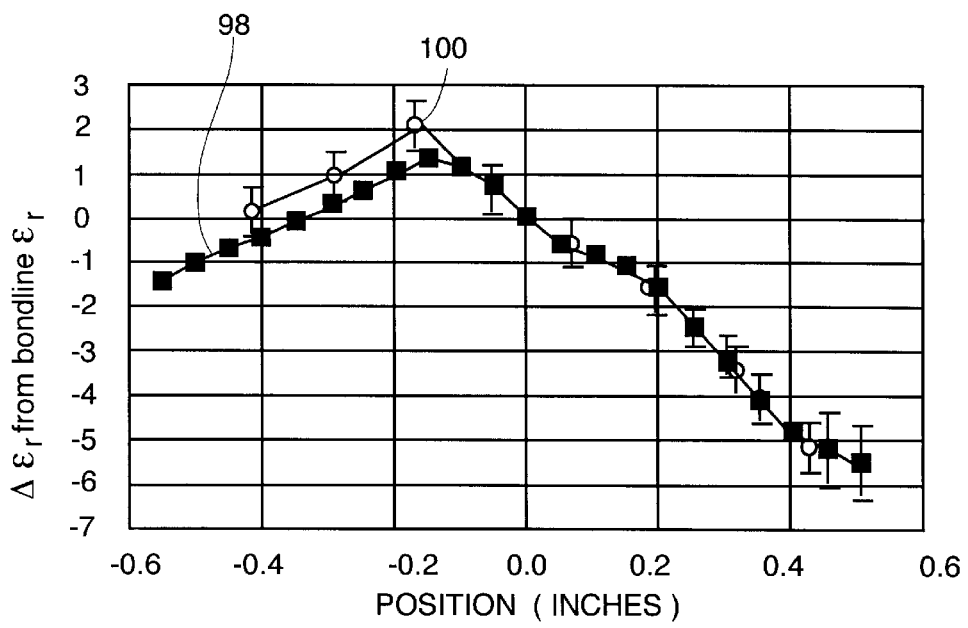
FIG. 17, on coordinates of deviation from the mean relative permittivity and position (in inches), is a plot of the dielectric homogeneity across a bonded BST tile measured using the method and apparatus of the present invention and with a prior art method.

FIG. 17 shows the dielectric homogeneity across a bonded BST tile measured with the method and apparatus 42 of the present invention and with a prior art method. Specifically, curves 98 and 100 in FIG. 17 plot the deviation from the permittivity at the bond line versus position on the bonded BST tile. Rexolite-like adhesive was employed to bond the BST tile. The bond line is located at −0.15 inches on the plot shown in FIG. 17. The permittivity at the bond line is estimated to be 34.

Curve 98 was obtained using the method of the present invention. Measurements for curve 98 were performed in ethanol. The end 34 of the guarded electrode 10 which is exposed to the bonded BST tile was circular with a diameter of 0.25 inch (0.635 cm). The sensitivity factor, S, was about 1.2. The value of S was intentionally set to be well above the preferred range for S (described above as between 1.008 and 1.02). Accordingly, measurement errors associated with the present invention were exaggerated to provide a conservative comparison between prior art plural electrodes and the apparatus 42 and method of the present invention. The error bars in curve 98 reflect a 15% uncertainty in the sensitivity factor, S.

Curve 100 was obtained using a plurality of discrete guarded electrodes. The electrodes comprised Au/Ag pads each having dimensions of 0.11×0.15 inch (0.28×0.38 cm). For each capacitance measurement at a given metal pad, the adjacent metal pads were electrically connected (using jumpers) to a surrounding larger region of metallization which serves as a guard thereby further reducing stray capacitance. The error bars in curve 100 reflect a 0.4% capacitance error and a 1% area error but do not include correction for the spacing of the guard electrodes 14 being less than twice the thickness of the test specimen 12. (To increase the resolution of the measurement using the plurality of discrete electrodes, the width of the metal pads that function as guards is less than twice the thickness of the test specimen. However, as described above, in the case where the metal pads used as guards does not extend beyond the guarded metal pad by at least twice the thickness of the test specimen, some error may be introduced in the capacitance measurements.) Nevertheless, both curve 98 and curve 100 are in agreement, indicating that the method and apparatus 42 of the present invention is effective in measuring dielectric homogeneity.

Thus, there has been disclosed a method and apparatus 42 for determining the dielectric homogeneity of materials at microwave frequencies. While the method and apparatus 42 of the invention for measuring dielectric homogeneity can be advantageously applied to the development and production of CTS-ESA radar antenna apertures and, in particular, to CTS-ESA radar antennas comprising BST-based materials, the present invention is not limited to these particular materials or end-products. It will be readily apparent to those skilled in this art that various changes and modifications of an obvious nature may be made, and all such changes and modifications are considered to fall within the scope of the invention, as defined by the appended claims.

What is claimed is:

1. An apparatus for measuring variation in the dielectric constant of a test specimen, said apparatus comprising:
   (a) a guarded electrode having sides and two ends and having a width;
   (b) a guard electrode surrounding said guarded electrode on all said sides, said guard electrode having a width, said guard electrode and said guarded electrode separated by a guard gap, at least one of said ends of said guarded electrode being exposed;
   (c) a planar electrode having said test specimen residing thereon, said guarded electrode and said guard electrode residing over said test specimen such that said end of said guarded electrode which is exposed faces said test specimen;
   (d) a container having sides and a bottom, said planar electrode residing on said bottom of said container;
   (e) a dielectric fluid filling a portion of said container such that said test specimen, said planar electrode, said end of said guarded electrode which faces said test specimen, and a portion of said guard electrode are submerged in said dielectric fluid;
   (f) means for translating said guarded electrode and said guard electrode a distance across said test specimen, said planar electrode having a length that is longer than said width of said guarded electrode and said surrounding guard electrode plus said distance that said guarded electrode and said guard electrode are translated; and
   (g) means for monitoring the capacitance between said guarded electrode and said planar electrode, thereby enabling said dielectric constant of said test specimen to be determined.

2. The apparatus of claim 1 wherein said variation in the dielectric constant is determined for microwave frequencies.

3. The apparatus of claim 2 wherein said capacitance between said guarded electrode and said planar electrode is measured at a frequency in the range of about 100 kHz and 10 MHz.

4. The apparatus of claim 1 wherein said guard gap comprises an insulator.

5. The apparatus of claim 4 wherein said insulator comprises polytetrafluoroethylene.

6. The apparatus of claim 1 wherein said guard gap is about 0.001 inches (0.0025 cm) wide.

7. The apparatus of claim 1 wherein said end of said guarded electrode which faces said test specimen has a shape selected from the group consisting of a circle and a rectangle.

8. The apparatus of claim 1 wherein said dielectric fluid is selected from the group consisting of ethanol, isopropyl alcohol, glycol, glycerol, and methanol.

9. The apparatus of claim 1 wherein said guarded electrode and said guard electrode are separated from said test specimen by a gap having a thickness less than about 0.002 inches (0.005 cm).

10. The apparatus of claim 1 wherein said test specimen comprises a barium strontium titanate-based material.

11. The apparatus of claim 10 wherein said test specimen comprises barium strontium titanate.

12. A method for measuring variation in the dielectric constant of a test specimen, said method comprising the steps of:
    (a) providing a container having sides and a bottom;
    (b) placing a planar electrode having a length on said bottom of said container;
    (c) placing said test specimen on said planar electrode;
    (d) placing a guarded electrode having sides and two ends and having a width above said test specimen, said guarded electrode surrounded on all sides by a guard electrode having a width, said guard electrode and said guarded electrode separated by a guard gap, at least one of said ends of said guarded electrode being exposed to said test specimen;
    (e) filling a portion of said container with a dielectric fluid such that said test specimen, said planar electrode, said end of said guarded electrode which is exposed to said test specimen, and a portion of said guard electrode are submerged in said dielectric fluid;
    (f) measuring the capacitance between said guarded electrode and said planar electrode;
    (g) translating said guarded electrode and said guard electrode a distance across said test specimen, said planar electrode having a length that is longer than said width of said guarded electrode and said surrounding guard electrode plus said distance that said guarded electrode and said guard electrode are translated; and
    (h) repeating steps (f) and (g) while maintaining said test specimen, said planar electrode, said end of said guarded electrode which is exposed to said test specimen, and said portion of said guard electrode submerged in said dielectric fluid, thereby determining spatial variation in said dielectric constant of said test specimen.

13. The method of claim 12 wherein said variation in the dielectric constant is determined for microwave frequencies.

14. The method of claim 13 wherein said dielectric constant at microwave frequencies is determined by measuring the dielectric constant at RF frequencies.

15. The method of claim 14 wherein said capacitance between said guarded electrode and said planar electrode is measured at a frequency in the range of about 100 kHz to 10 MHz.

16. The method of claim 12 wherein an area of said test specimen is covered by said guarded electrode said test specimen has a thickness, $t_{sample}$, and said variation in said dielectric constant of said test specimen is related to variation in said capacitance between said guarded electrode and said planar electrode using the formula:

$$\Delta\in_r = (\Delta C_m)(t_{sample})(S)/A/K,$$

wherein $\Delta C_m$, is said variation is said capacitance, $\Delta\in_r$ is said variation in said dielectric constant, A is said area covered by said guarded electrode, K is a constant, and S is a correction factor, and wherein said test specimen has a dielectric constant, $\in_{sample}$, said dielectric fluid filling said gap has a dielectric constant of $\in_{gap}$, said gap separating said guarded electrode and said sample has a thickness of $t_{gap}$, and said correction factor, S, is given by the following formula:

$$S = 1 + (\in_{sample}/\in_{gap})(t_{gap}/t_{sample}).$$

17. The method of claim 12 wherein said guard gap comprises an insulator.

18. The method of claim 17 wherein said insulator comprises polytetrafluoroethylene.

19. The method of claim 12 wherein said end of said guarded electrode which is exposed to said test specimen has a shape selected from the group consisting of a circle and a rectangle.

20. The method of claim 12 wherein said dielectric fluid is selected from the group consisting of ethanol, isopropyl alcohol, glycol, glycerol, and methanol.

21. The method of claim 12 wherein said guarded electrode and said guard electrode are separated from said test specimen by a gap having a thickness less than about 0.002 inches (0.005 cm).

22. The method of claim 12 wherein said test specimen comprises a barium strontium titanate-based material.

23. The method of claim 11 wherein said test specimen comprises barium strontium titanate.

* * * * *